United States Patent [19]

Watanabe et al.

[11] 4,362,998

[45] Dec. 7, 1982

[54] FM DETECTOR USING A PHASE SHIFT NETWORK AND AN ANALOG MULTIPLIER

[75] Inventors: Kazuo Watanabe, Kokubunji; Masanori Ienaka, Kodaira; Yasuo Kominami, Kokubunji; Makoto Homma, Hamura, all of Japan

[73] Assignee: Hitachi, Ltd., Tokyo, Japan

[21] Appl. No.: 7,981

[22] Filed: Jan. 31, 1979

[30] Foreign Application Priority Data

Mar. 29, 1978 [JP] Japan .................................. 53/35510
Mar. 29, 1978 [JP] Japan .................................. 53/35512
Mar. 29, 1978 [JP] Japan .................................. 53/35513

[51] Int. Cl.³ .............................................. H03D 3/14
[52] U.S. Cl. ...................................... 329/103; 329/138; 455/214
[58] Field of Search ............... 329/103, 137, 138, 110; 325/349, 344; 330/252, 257, 259; 455/214, 337

[56] References Cited

U.S. PATENT DOCUMENTS

| | | | |
|---|---|---|---|
| 3,597,639 | 8/1971 | Harwood | 330/252 X |
| 3,667,060 | 5/1972 | Avins | 329/103 |
| 4,100,500 | 7/1978 | Ohsawa et al. | 329/103 |
| 4,122,394 | 10/1978 | Fukushima et al. | 329/103 X |

*Primary Examiner*—Siegfried H. Grimm
*Attorney, Agent, or Firm*—Antonelli, Terry & Wands

[57] ABSTRACT

An FM detector is constructed of a phase shift network and an analog multiplier. The analog multiplier includes a differential amplifier circuit and a phase detector circuit. The differential amplifier circuit includes differential pair transistors which are driven by FM intermediate frequency signals. One of the differential pair transistors has another transistor connected thereto which is also driven by the FM intermediate frequency signal. A collector signal of either one of the differential pair transistors is applied to the phase detector circuit through the phase shift network, while a collector signal of the other transistor is directly applied to the phase detector circuit. An emitter of the one transistor and an emitter of the other transistor are connected through resistors, whereby the signal-to-noise ratio of the FM detector is improved.

8 Claims, 5 Drawing Figures

FM DETECTOR USING A PHASE SHIFT NETWORK AND AN ANALOG MULTIPLIER

BACKGROUND OF THE INVENTION

This invention relates to an FM detector, and more particularly to an FM detector which employs an analog multiplier and a phase shift network.

FM detectors employing analog multipliers and phase shift networks have been known from "1968 INTERNATIONAL SOLID-STATE CIRCUITS CONFERENCE DIGEST OF TECHNICAL PAPERS", pp. 116–117; "IEEE JOURNAL OF SOLID-STATE CIRCUITS", VOL. SC-3, No. 4, December 1968, pp. 373–380; etc.

In the FM detectors of this type, an FM input signal and a signal which is provided from the phase shift network and which has a phase deviation proportional to the frequency of the FM input signal are applied to the analog multiplier.

The known FM detector is put into the form of a semiconductor integrated circuit, and has its circuits directly coupled. Demodulated signals are derived from the collectors of a plurality of transistors which constitute the multiplier and whose bases and emitters are respectively connected in common.

With the circuit arrangement, even when the delay times of the individual transistors have fluctuated in dependence on the FM signal level, the output signals of these transistors are not influenced by the fluctuations in the delay times because the transistors execute substantially the same operations. As a result, the phases of the output signals of the FM detector are not subject to any evil effect attributed to the variation of the FM input signal level.

According to the inventors' study, however, it has been revealed that with the known FM detector, the signal-to-noise ratio of a detected output signal obtained is comparatively low.

SUMMARY OF THE INVENTION

It is accordingly an object of this invention to provide an FM detector of high signal-to-noise ratio.

another object of this invention is to provide an FM detector suited to a semiconductor integrated circuit.

DESCRIPTION OF THE PREFERRED EMBODIMENTS

Figure 1:
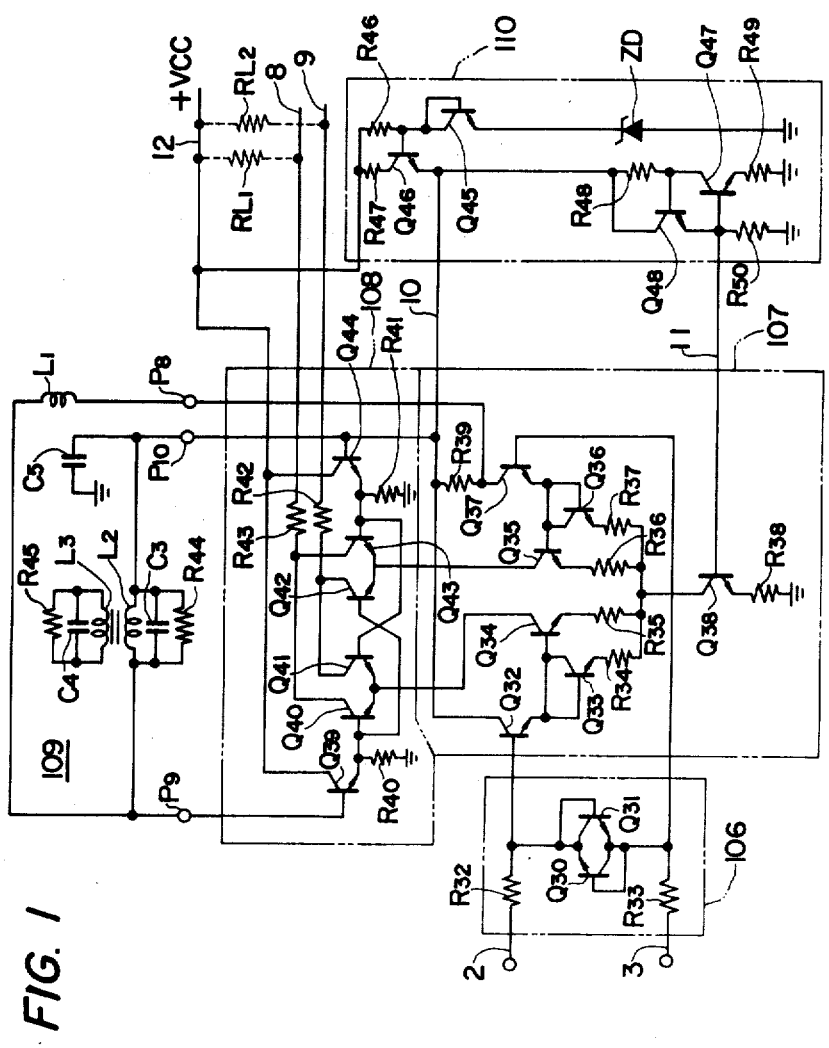
FIG. 1 shows an FM detector according to an embodiment of this invention.

FIG. 1 is a circuit diagram of an FM detector embodying this invention.

Referring to the figure, numeral 106 designates a clamp circuit, numeral 107 a differential amplifier circuit which forms part of a multiplier, numeral 108 a phase detector circuit which similarly forms part of the multiplier, numeral 109 a phase shift network, and numeral 110 a constant-voltage bias circuit.

FM input signals opposite in phase from each other are supplied to input lines 2 and 3 from an FM intermediate frequency amplifier circuit (not shown) which is constructed in the form of a differential amplifier circuit and which effects an amplitude-limiting operation. The clamp circuit 106 is composed of resistors $R_{32}$ and $R_{33}$, and diode-connected N-P-N transistors $Q_{30}$ and $Q_{31}$ which are connected in a parallel inverse relationship. When the difference of the levels of the output signals of the FM intermediate frequency amplifier circuit has a large value exceeding the base-emitter forward voltage of the transistors $Q_{30}$ and $Q_{31}$, the clamp circuit 106 clamps the level difference at the forward voltage.

The differential amplifier circuit 107 is composed of transistors $Q_{32}$ to $Q_{38}$ and resistors $R_{34}$ to $R_{39}$. The differential amplifier circuit 107 essentially includes the differential pair N-P-N transistors $Q_{34}$ and $Q_{35}$, which are driven in phases opposite to each other by the FM input signals applied to the input lines 2 and 3. The diode-connected N-P-N transistors $Q_{33}$ and $Q_{36}$ are respectively connected between the bases and emitters of the differential pair transistors $Q_{34}$ and $Q_{35}$. The transistor $Q_{34}$ and the diode-connected transistor $Q_{33}$ are connected to the terminal 2 through the emitter-follower N-P-N transistor $Q_{32}$, while the transistor $Q_{35}$ and the diode-connected transistor $Q_{36}$ are connected to the terminal through the emitter-follower N-P-N transistor $Q_{37}$.

The bases of the transistor $Q_{34}$ and the diode-connected transistor $Q_{33}$ are connected with each other and the emitters are connected with each other through the resistors $R_{34}$ and $R_{35}$ of 50Ω–2 kΩ, preferably 200Ω, so that the two transistors $Q_{33}$ and $Q_{34}$ constitute a current mirror circuit. Since the emitter of the emitter-follower transistor $Q_{32}$ is connected to the base and collector of the transistor $Q_{33}$, the ratio of the current values of the collector currents of the transistors $Q_{32}$ and $Q_{34}$ is directly proportional to the ratio of the emitter junction areas of the transistors $Q_{33}$ and $Q_{34}$. Accordingly, the transistors $Q_{32}$ and $Q_{34}$ fall into substantially the same operating states.

Likewise, the transistors $Q_{37}$ and $Q_{35}$ fall into substantially the same operating states The balanced collector outputs of the differential pair transistors $Q_{34}$ and $Q_{35}$ are supplied to the phase detector circuit 108.

The collector output of the transistor $Q_{37}$ is applied to the phase shift network 109 through a terminal $P_8$.

The phase shift network 109 is made up of an inductor $L_1$, mutually-coupled inductors $L_2$ and $L_3$, resistors $R_{44}$ and $R_{45}$, and capacitors $C_3$ and $C_4$. The phase shift network 109 feeds the other input terminal $P_9$ of the phase detector circuit 108 with a signal which is subjected to a phase deviation of about 90° at the carrier signal frequency of the FM signals.

The phase detector circuit 108 includes transistors $Q_{39}$ to $Q_{44}$ and resistors $R_{40}$ to $R_{43}$. The output signal provided from the phase shift network 109 is supplied to the bases of the transistors $Q_{40}$ and $Q_{42}$ through an emitter-follower circuit which consists of the transistor $Q_{39}$ and the resistor $R_{40}$, while an output voltage of an emitter-follower circuit which consists of the transistor $Q_{44}$ and the resistor $R_{41}$ is supplied to the bases of the transistors $Q_{41}$ and $Q_{43}$. The base of the emitter-follower transistor $Q_{44}$ receives a constant bias voltage from the voltage regulator circuit 110 which includes a Zener diode ZD and an emitter-follower transistor $Q_{46}$, and it is also connected to an A.C.-grounding capacitor $C_5$ through a terminal $P_{10}$. Accordingly, the base potentials of the transistors $Q_{41}$ and $Q_{43}$ are fixed potentials.

In the phase detector circuit 108 the collector currents of the transistors $Q_{40}$ and $Q_{43}$ vary depending upon the phase difference between the balanced signals of the differential transistors $Q_{34}$ and $Q_{35}$ respectively applied to the common emitters of the transistors $Q_{40}$ and $Q_{41}$ and to the common emitters of the transistors $Q_{42}$ and $Q_{43}$ and the phase signal applied to the terminal $P_9$ from the phase shift network 109. The collector currents of the transistors $Q_{41}$ and $Q_{42}$ change in the direction opposite to that of the above variations.

As a result, detected signals opposite in phase to each other appear on lines 8 and 9 with which loads $RL_1$ and $RL_2$ are respectively connected.

In the above circuit, as stated previously, the transistors $Q_{32}$ and $Q_{34}$ and the transistors $Q_{37}$ and $Q_{35}$ have substantially the same operating levels, respectively. Therefore, the fluctuations of the delay times of the output signals of the differential pair transistors $Q_{34}$ and $Q_{35}$ corresponding to the amplitude variations of the FM signals applied to the input lines 2 and 3 and the fluctuation of the delay time of the output signal of the transistor $Q_{37}$ are substantially in agreement, so that the phase detector circuit 108 is not subject to the influence of a phase variation ascribable to the fluctuations of the delay times.

In this embodiment, the transistors $Q_{37}$ and $Q_{35}$ are directly coupled, and noise generated in the base region of the transistor $Q_{37}$ appears in the emitter thereof as it is without undergoing voltage amplification. Noise generated in the base region of the transistor $Q_{35}$ is attenuated by the low output impedance of the emitter-follower transistor $Q_{37}$. The amplification factor for the noise which at least one of the transistors $Q_{37}$ and $Q_{35}$ generates is comparatively low. In addition, the resistors $R_{36}$ and $R_{37}$ are negative feedback resistors for the noise, and they function to further lower the amplification factor for the noise. Influences due to noise of the transistors $Q_{32}$ and $Q_{34}$ are similarly small.

With the circuit of this embodiment, therefore, noise levels in the detection signals to be obtained on the output lines 8 and 9 can be made low.

This invention is not restricted to the embodiment as shown in FIG. 1. For example, balanced signals may be supplied to the phase detector circuit 108 from the transistors $Q_{32}$ and $Q_{37}$ in FIG. 1 and a signal to the phase shift network from the collector of the transistor $Q_{35}$ may be supplied.

Figure 2:
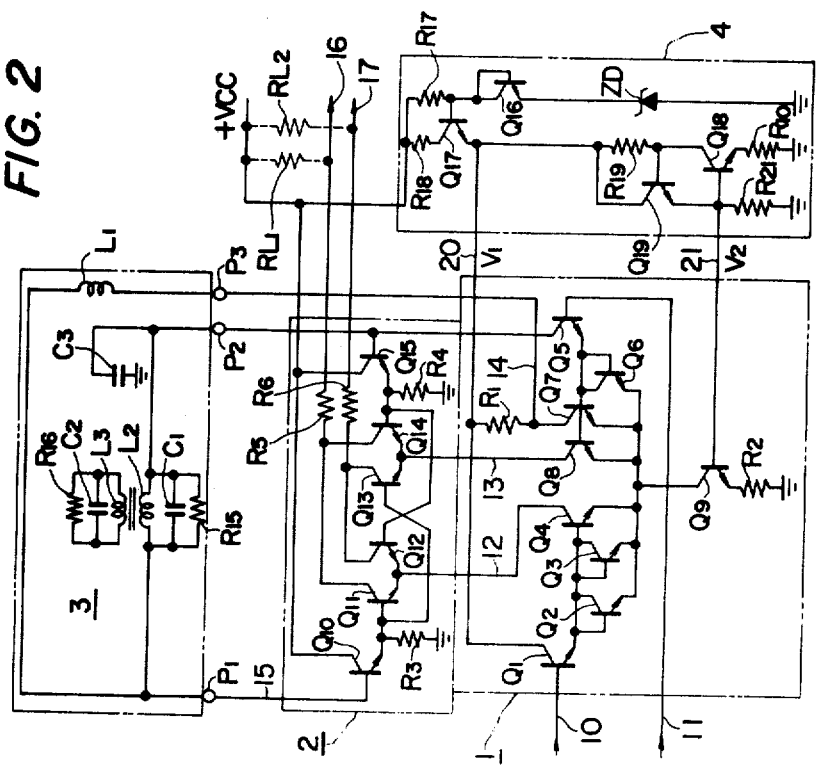
FIG. 2 shows an FM detector according to another embodiment of this invention.

FIG. 2 is a circuit diagram of an FM detector according to another embodiment of this invention.

Referring to the figure, numeral 1 designates a differential amplifier circuit which forms part of a multiplier, numeral 2 a phase detector circuit which similarly forms part of the multiplier, numeral 3 a phase shift network, and numeral 4 a constant-voltage bias circuit.

Input lines 10 and 11 are supplied with FM input signals of phases opposite to each other from an FM intermediate frequency amplifier circuit (not shown) which is constructed in the form of a differential amplifier circuit and which executes an amplitude-limiting operation.

The differential amplifier circuit 1 includes transistors $Q_1$ to $Q_8$ and resistors $R_1$ and $R_2$.

The emitters of the transistors $Q_2$ to $Q_4$ and the transistors $Q_6$ to $Q_8$ are connected to the collector of a constant-current transistor $Q_9$ in common.

The respective transistors are simultaneously fabricated by well-known semiconductor integrated circuit techniques. Among them, the diode-connected transistors $Q_2$ and $Q_6$ are made with the same structure and the same dimensions, so that they have equal current-voltage characteristics. The diode-connected transistor $Q_3$ is disposed in order to cause an emitter current in differential correspondence with the transistor $Q_7$, and it has the same structure and same dimensions as those of the transistor $Q_7$.

The differential amplifier circuit 1 essentially includes the differential pair transistors $Q_4$ and $Q_8$. These transistors $Q_4$ and $Q_8$ receive the FM input signals of the input lines 10 and 11 through the emitter-follower transistors $Q_1$ and $Q_5$ respectively, thereby to provide balanced signals at the respective collectors.

The balanced signals provided from the differential pair transistors $Q_4$ and $Q_8$ provide an input signal to the phase detector circuit 2.

Between the base and emitter of transistor $Q_8$ of the differential pair transistors, the base-emitter junction of the transistor $Q_7$ is connected in parallel. The collector output of the transistor $Q_7$ is applied to the phase shift network 3 through a terminal $P_3$.

The phase shift network 3 includes an inductor $L_1$, mutually-coupled inductors $L_2$ and $L_3$, resistors $R_{15}$ and $R_{16}$ and capacitors $C_1$ and $C_2$. The phase shift network 3 feeds the other input terminal $P_1$ of the phase detector circuit 2 a signal which is subjected to a phase deviation of about 90° at the carrier signal frequency of the FM signals.

The phase detector circuit 2 includes transistors $Q_{10}$ to $Q_{15}$ and resistors $R_3$ to $R_6$. The output signal provided from the phase shift network 3 is supplied to the bases of the transistors $Q_{11}$ and $Q_{13}$ through an emitter-follower circuit which consists of the transistor $Q_{10}$ and the resistor $R_3$, while an output voltage of an emitter-follower circuit which consists of the transistor $Q_{15}$ and the resistor $R_4$ is supplied to the bases of the transistors $Q_{12}$ and $Q_{14}$. The base of the transistor $Q_{15}$ receives a constant bias voltage $V_1$ through the resistor $R_1$ and the indicators $L_1$ and $L_2$ from the constant-voltage bias circuit 4 which includes a Zener diode ZD and an emitter-follower transistor $Q_{17}$, and it is also connected to an A.C.-grounding capacitor $C_3$ through a terminal $P_2$. Accordingly, the base potentials of the transistors $Q_{12}$ and $Q_{14}$ are fixed potentials.

In the phase detector circuit 2, the collector currents of the transistors $Q_{11}$ and $Q_{14}$ vary depending upon the phase difference between the balanced signals from the differential transistors $Q_4$ and $Q_8$ respectively applied to the common emitters of the transistors $Q_{11}$ and $Q_{12}$ and to the common emitters of the transistors $Q_{13}$ and $Q_{14}$ and the phase signal applied to the terminal $P_1$ from the phase shift network 3. The collector currents of the transistors $Q_{12}$ and $Q_{13}$ change in the direction opposite to that of the above variations.

In consequence, detected signals of phases opposite to each other appear on lines 16 and 17 with which loads $RL_1$ and $RL_2$ are respectively connected.

In the above circuit, the transistors $Q_7$ and $Q_8$ come to have substantially the same operating levels. Therefore, the variations of the delay times of the output signals of the differential pair transistors $Q_4$ and $Q_8$ corresponding to the amplitude variations of the FM signals applied to the input lines 10 and 11 and the variation of the delay time of the output signal of the transistor $Q_7$ are substantially in agreement, so that the phase detector circuit 2 is not subject to the influence of a phase variation due to the variations of the delay times.

In general, regarding two transistors whose bases and emitters are connected in parallel, when at least one of the transistors generates noise, the other responds thereto. For example, when a noise develops in the base of the first transistor, a noise potential is applied to the base of the second transistor on account of the noise of the first transistor. As a result, the first and second transistors operate differentially in response to the noise of the first transistor. In this manner, the noise generated by the first transistor appears differentially at the collector of the second transistor. In this embodiment, however, the diode-connected transistor $Q_6$ for the current mirror operation is connected between the bases and emitters of the transistors $Q_7$ and $Q_8$ which are connected in parallel, and the emitter of the emitter-follower transistor $Q_5$ which exhibits a low output impedance is also connected to the bases of the transistors $Q_7$ and $Q_8$, so that even when a noise develops in the base of at least one of the transistors $Q_7$ and $Q_8$, this noise is decayed by the emitter-follower transistor $Q_5$ and the diode-connected transistor $Q_6$. Accordingly, noise appearing at the collectors of the transistors $Q_7$ and $Q_8$ may be lessened.

Figure 3:
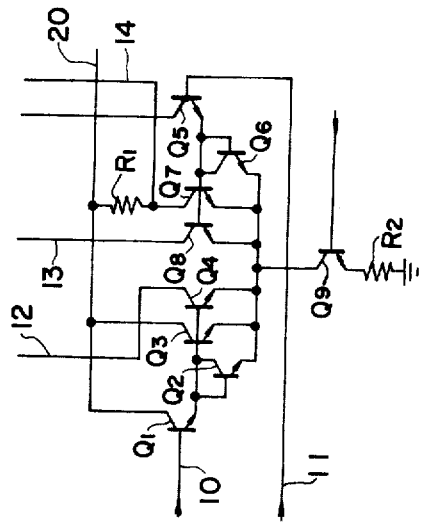
FIG. 3 shows a modification from the embodiment of FIG. 2.

This invention can be modified from the above embodiment. FIG. 3 shows a modification wherein the diode-connected transistor $Q_3$ in FIG. 2 is replaced with a transistor $Q_3$ whose collector is connected to a power supply line 20. In this case, the variations of the delay times of the output signals of the transistors $Q_4$ and $Q_8$ and the variation of the delay time of the output signal of the transistor $Q_7$ agree still better.

In a preferred aspect of performance of this invention, emitter resistors are inserted between the emitters of two transistors whose bases are connected in common and a common function.

In general, a transistor generates undesirable noise especially within its base region. In the case where the bases of two transistors are connected in common, a noise generated in the base region of at least one of the transistors applies a noise voltage to the bases of the two transistors. The two transistors consequently execute a differential operation in response to the noise in case where their bases and emitters are respectively connected in common. That is, the noise of one transistor also appears at the collector of the other transistor.

The emitter resistors exert a negative feedback effect on the transistors, with the result that the differential gain for the noise due to the two transistors lowers. In general, thermal noise etc. which is generated by a passive element such as resistor is low relative to noise levels which are generated by an active element such as transistor. Therefore, the noise appearing at the collector of the transistor with the emitter resistor inserted as above described may be diminished.

Figures 4, 5:
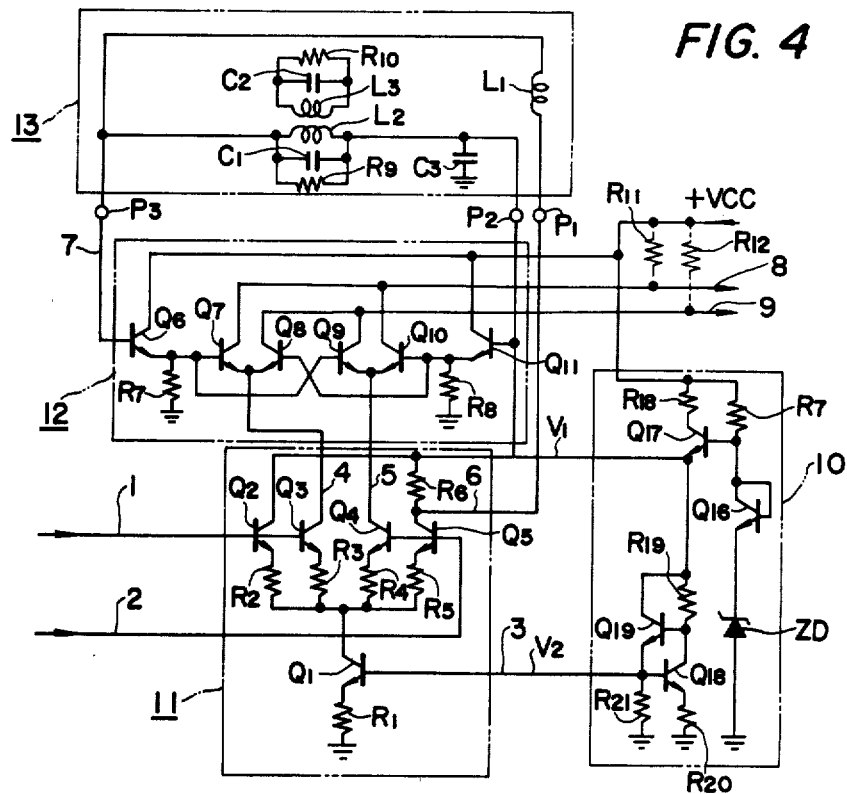
FIG. 4 shows an FM detector according to still another embodiment of this invention.
FIG. 5 shows a modification from the embodiment of FIG. 4.

FIG. 4 shows a circuit diagram of an FM detector according to a preferred embodiment of this invention.

Referring to the figure, numeral 11 designates a differential amplifier circuit which forms part of a multiplier, numeral 12 a phase detector circuit which similarly forms part of the multiplier, and numeral 13 a phase shift network. Shown at 10 is a constant-voltage bias circuit for supplying stabilized bias voltages to the respective circuits.

Input lines 1 and 2 are supplied with differential signals from an FM intermediate frequency amplifier circuit (not shown) which is constructed in the form of a differential amplifier circuit and which effects the amplitude-limiting amplifications of FM input signals converted into an intermediate frequency.

The differential amplifier circuit 11 is made up of transistors $Q_1$ to $Q_5$ and resistors $R_1$ to $R_6$. The transistor $Q_1$ receives a bias voltage from the constant-voltage bias circuit 10 including a Zener diode ZD and an emitter-follower transistor $Q_{17}$, and thereby causes a constant current to flow to the collector thereof. The emitters of the transistors $Q_2$ to $Q_5$ are connected to the collector of the constant-current transistor $Q_1$ through the emitter resistors $R_2$ to $R_5$ of $50\Omega$–2 k $\Omega$, preferably $200\Omega$. The bases of the transistors $Q_2$ and $Q_3$ are connected in common, and the bases of the transistors $Q_4$ and $Q_5$ are similarly connected in common.

The two transistors $Q_2$ and $Q_3$ and the two transistors $Q_4$ and $Q_5$ execute a differential operation in dependence on the FM signals subjected to the amplitude-limiting amplification as applied to the lines 1 and 2.

The balanced collector outputs of the transistors $Q_3$ and $Q_4$ are supplied to the phase detector circuit 12.

An output which appears at the load resistor $R_6$ of the transistor $Q_5$ is supplied to the phase shift network 13.

In the above circuit, the transistors $Q_2$ and $Q_3$ and the transistors $Q_4$ and $Q_5$ have the bases and emitters connected in common as stated before, so that they assume equal operating levels even when common mode amplitude variations have arisen in the FM signals to be applied to the lines 1 and 2. Owing to the differential connection, the transistors $Q_2$ to $Q_5$ fall within the same D.C. operation level range.

Accordingly, the phase difference between the collector outputs of the transistors $Q_3$ and $Q_4$ and the collector output of the transistor $Q_5$ becomes constant irrespective of the amplitude variations of the FM signals applied to the lines 1 and 2.

The transistors $Q_2$ and $Q_3$ generate only noise reduced by the emitter resistors $R_2$ and $R_3$ thereof. Likewise, the transistors $Q_4$ and $Q_5$ generate only reduced noise.

Although not specifically restricted, the phase shift network 13 consists of an inductor $L_1$, mutually-coupled inductors $L_2$ and $L_3$, resistors $R_9$ and $R_{10}$ and capacitors $C_1$ and $C_2$ as shown in the figure. It provides a signal of a phase deviation which is proportional to the frequency of a signal supplied from the transistor $Q_5$ of the differential amplifier circuit 11. A capacitor $C_3$ is for grounding A.C.

The phase detector circuit 12 is composed of transistors $Q_6$ to $Q_{11}$ and resistors $R_7$ and $R_8$. This circuit detects the phase of the phase-deviated signal applied from the phase shift network 13 to the transistor $Q_6$ and the balanced signals applied to the common emitters of the transistor $Q_7$ and $Q_8$ and the common emitters of the transistors $Q_9$ and $Q_{10}$.

As a result, a detected signal corresponding to the phase deviation is obtained at a load resistor $R_{11}$ which is connected to the collectors of the transistors $Q_7$ and $Q_{10}$ in common, while a detected signal opposite in phase to the signal of the load resistor $R_{11}$ is obtained at a load resistor $R_{12}$ which is connected to the collectors of the transistors $Q_8$ and $Q_9$ in common.

FIG. 5 shows a modification wherein emitter-follower transistors $Q_{21}$ and $Q_{24}$, diode-connected transistors $Q_{22}$ and $Q_{23}$ and resistors $R_{20}$ and $R_{21}$ of $200\Omega$ are added to the differential amplifier circuit 11 in FIG. 4. In the above, the transistors $Q_2$ and $Q_3$ effect a current mirror operation for the transistor $Q_{22}$, and the transistors $Q_4$ and $Q_5$ similarly effect a current mirror operation for the transistor $Q_{23}$. In this circuit, the transistor $Q_{21}$ is of the emitter-follower construction, so that noise generated in the base regions of the transistors $Q_2$ and $Q_3$ can be suppressed to be still lower owing to the low output impedance of the transistors $Q_2$. Likewise, noise of the transistors $Q_4$ and $Q_5$ can be suppressed to be low.

What is claimed is:

1. In an FM detector comprising:
   (1) a phase shift network for obtaining a phase shift signal whose phase is shifted from that of FM intermediate frequency signal, and
   (2) an analog multiplier for obtaining an FM detected output signal by detecting a difference between the phases of said FM intermediate frequency signal and said phase shift signal, said analog multiplier including a differential amplifier circuit and a phase detector circuit, said differential amplifier circuit including first and second transistors connected as a differential pair which is driven by said FM intermediate frequency signal, at least said phase shift signal being applied to said phase detector circuit, the improvement therein comprising:
   (1) a third transistor which is driven by the FM intermediate frequency signal is connected to one of said first and second transistors,
   (2) an emitter of said one transistor and an emitter of said third transistor being connected through respective resistors, and
   (3) either one of a collector output of said one transistor and a collector output of said third transistor being directly applied to said phase detector circuit, while the other is applied to said phase detector circuit through said phase shift network,
   (4) a fourth transistor connected to the other of said first and second transistors connected as said differential pair, and
   (5) an emitter of said other transistor and an emitter of said fourth transistor being connected through respective resistors, and further comprising a constant-current transistor, said respective resistors being connected to said emitters of said first, second, third and fourth transistors having their ends remote from said emitters connected to a collector of said constant-current transistor in common.

2. The FM detector according to claim 1, wherein bases of said one transistor and said third transistor are connected in common, and bases of said other transistor and said fourth transistor are connected in common.

3. In an FM detector comprising:
   (1) a phase shift network for obtaining a phase shift signal whose phase is shifted from that of an FM intermediate frequency signal, and
   (2) an analog multiplier for obtaining an FM detection signal by detecting a difference between the phases of said FM intermediate frequency signal and said phase shift signal, said analog multiplier including a differential amplifier circuit and a phase detector circuit, said differential amplifier circuit including first and second transistors, the emitters of which are connected in a differential form, and at least one of the bases of which is driven by said FM intermediate frequency signal, at least said phase shift signal being applied to said phase detector circuit,
   the improvement comprising:
   (1) a third transistor, the base of which is connected to the base of said first transistor,
   (2) a fourth transistor, the base of which is connected to the base of said second transistor,
   (3) a first resistor, the one end of which is connected to the emitter of said first transistor,
   (4) a second resistor, the one end of which is connected to the emitter of said second transistor,
   (5) a third resistor, the one end of which is connected to the emitter of said third transistor,
   (6) a fourth resistor, the one end of which is connected to the emitter of said fourth transistor,
   (7) a constant-current transistor, the collector of which is connected to other ends of said first, second, third and fourth resistors, and
   (8) wherein a collector output of said first transistor is applied to said phase detector circuit, while a collector output of said fourth transistor is applied to said phase detector circuit through said phase shift network.

4. In an FM detector comprising:
   (1) a phase shift network for obtaining a phase shift signal whose phase is shifted from that of an FM intermediate frequency signal, and
   (2) an analog multiplier for obtaining an FM detection signal by detecting a difference between the phases of said FM intermediate frequency signal and said phase shift signal, said analog multiplier including a differential amplifier circuit and a phase detector circuit, said differential amplifier circuit including first and second transistors, the emitters of which are connected in a differential form, and at least one of the bases of which is driven by said FM intermediate frequency signal, at least said phase shift signal being applied to said phase detector circuit,
   the improvement comprising:
   (1) a third transistor, the base and the collector of which are connected to the base of said first transistor,
   (2) a fourth transistor, the base and the collector of which are connected to the base of said second transistor,
   (3) a fifth transistor, the emitter of which is connected to the bases of said first and third transistors,
   (4) a sixth transistor, the emitter of which is connected to the bases of said second and fourth transistors,
   (5) a first resistor, the one end of which is connected to the emitter of said first transistor,
   (6) a second resistor, the one end of which is connected to the emitter of said second transistor,
   (7) a third resistor, the one end of which is connected to the emitter of said third transistor,
   (8) a fourth resistor, the one end of which is connected to the emitter of said fourth transistor,
   (9) a constant-current transistor, the collector of which is connected to other ends of said first, second, third and fourth resistors, and
   (10) wherein either a collector output of said first transistor or a collector output of said sixth transistor is applied to said phase detector circuit, while the other is applied to said phase detector circuit through said phase shift network.

5. The FM detector according to claim 4, wherein said first, second, third and fourth resistors are of $50\Omega$-$2 k\Omega$.

6. An FM detector, comprising:

(1) a phase shift network for obtaining a phase shift signal whose phase is shifted from that of an FM intermediate frequency signal, and (2) an analog multiplier for obtaining an FM detection signal by detecting a difference between the phases of said FM intermediate frequency signal and said phase shift signal, said analog multiplier including a differential amplifier circuit and a phase detector circuit, said differential amplifier circuit including first and second transistors, the emitters of which are connected in a differential form, and at least one of the bases of which is driven by said FM intermediate frequency signal, at least said phase shift signal being applied to said phase detector circuit, the improvement comprising:

(1) a third transistor, the base of which is connected to the base of said first transistor, (2) a fourth transistor, the base of which is connected to the base of said second transistor, (3) a first resistor, the one end of which is connected to the emitter of said first transistor, (4) a second resistor, the one end of which is connected to the emitter of said second transistor, (5) a third resistor, the one end of which is connected to the emitter of said third transistor, (6) a fourth resistor, the one end of which is connected to the emitter of said fourth transistor, (7) a constant-current transistor, the collector of which is connected to other ends of said first, second, third and fourth resistors, (8) wherein a collector output of said first transistor is applied to said phase detector circuit, while a collector output of said fourth transistor is applied to said phase detector circuit through said phase shift network, (9) a fifth transistor, the emitter of which is connected to the bases of said first and third transistors, and

(10) a sixth transistor, the emitter of which is connected to the bases of said second and fourth transistors.

7. The FM detector according to claim 6, further comprising:

(1) a seventh transistor, the base and the collector of which are connected to the bases of said first and third transistors, (2) an eighth transistor, the base and the collector of which are connected to the bases of said second and fourth transistors, (3) a fifth resistor, the one end of which is connected to the emitter of said seventh transistor, (4) a sixth resistor, the one end of which is connected to the emitter of said eighth transistor, and (5) wherein the other ends of said fifth and sixth resistors are connected to said collector of said constant-current transistor.

8. The FM detector according to claim 3, 6, or 7 wherein said first, second, third and fourth resistors are of $50\Omega$–$2\ k\Omega$.

* * * * *